United States Patent

[11] 3,610,811

[72] Inventor James E. O'Keefe
Phoenix, Ariz.
[21] Appl. No. 829,492
[22] Filed June 2, 1969
[45] Patented Oct. 5, 1971
[73] Assignee Honeywell Information Systems Inc.

[54] PRINTED CIRCUIT BOARD WITH SOLDER RESIST GAS ESCAPE PORTS
14 Claims, 8 Drawing Figs.

[52] U.S. Cl. .......... 174/68.5, 29/490, 29/626, 317/101 CC, 339/17 C
[51] Int. Cl. .......... H05k 1/18, H05k 3/32
[50] Field of Search .......... 174/68.5; 317/101 B, 101 C, 101 CC, 101 CM, 101 D; 29/625–627, 628, 490; 339/275 B, 17, 17 C

[56] References Cited
UNITED STATES PATENTS
3,214,827 11/1965 Phohofsky .......... 174/68.5 X

*Primary Examiner*—Darrell L. Clay
*Attorneys*—Edward W. Hughes and Fred Jacob

ABSTRACT: A circuit board having apertures within which circuit component leads are soldered and having a surface coated with solder resist in a universal pattern. The solder resist coating intersects the periphery of the apertures to alter the temperature environment in the aperture during the soldering process, preventing the formation of solder fillets at the board surface and permitting gasses to escape from the apertures.

INVENTOR
JAMES E. O'KEEFE

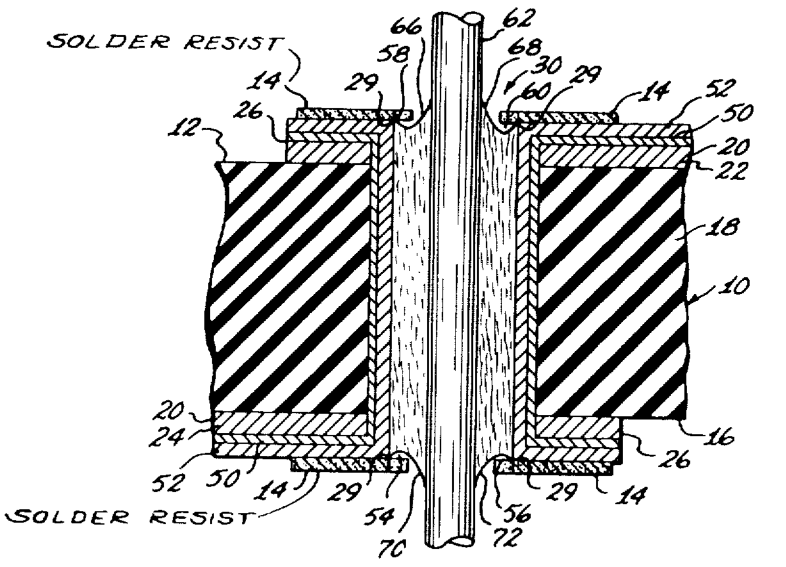
FIG. 4
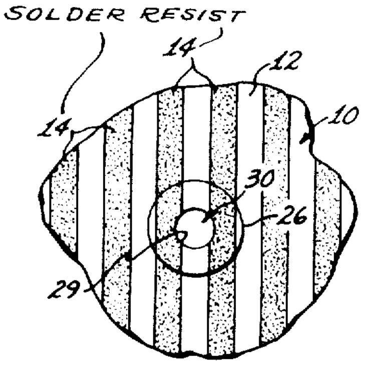
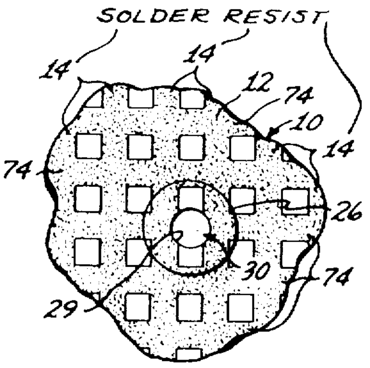
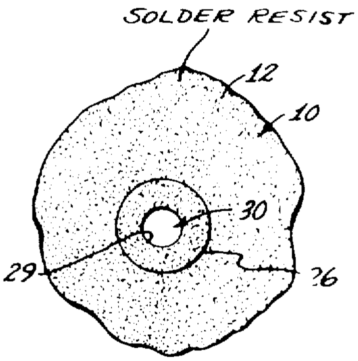
FIG. 5 FIG. 6 FIG. 7
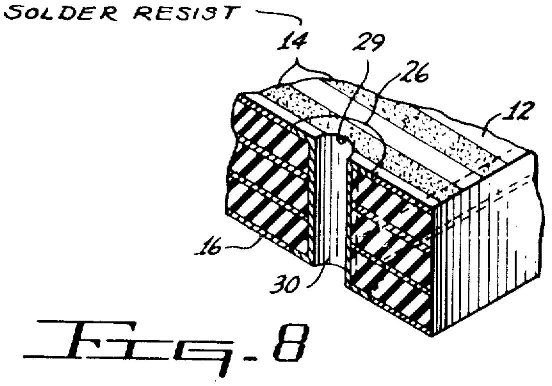
FIG. 8

PRINTED CIRCUIT BOARD WITH SOLDER RESIST GAS ESCAPE PORTS

BACKGROUND OF THE INVENTION

This invention relates to the art of assembling electric circuits, and more particularly to the art of assembling electric circuits wherein circuit components are soldered to circuit boards having conductive and insulative layers.

This invention is particularly suitable for use in fabricating etched or printed circuit structures termed "double sided plated-through hole printed circuit boards" and "multilayer printed circuit boards". In such printed circuit boards, circuit components are mounted upon an insulative panel or layer having conductive lines connected to apertured mounting pads formed in a conductive layer bonded thereon for interconnecting wires or leads of the various components.

In one form, the circuit boards are fabricated from conductive layers bonded to opposite sides of an insulative panel, the desired lines and pads being formed by selectively etching away the conductive layers in the regions between the lines, pads, and apertures within the pads. The boards include conductive lines and pads on two surfaces thereof and apertures or plated through holes having a conductive lining or bores coated with normally porous platings and extending through the boards interconnecting the apertures of pads. Apertures originating at pads on one surface hereinafter referred to as the top surface of the board are thereby interconnected with apertures terminating at pads on an opposite surface hereinafter referred to as the bottom surface of the board.

After all of the components have been mounted on the top surface by passing each components' leads through associated appertures of pads and holes, and a suitable soldering flux applied to the surfaces and hole bores, the lead is soldered by placing the bottom or opposite surface of the board in contact with molten solder. Component leads are thereby soldered to the holes and pads through the formation of solder fillets around the leads within the holes termed "barrel fillets" and fillets between the surfaces of the board and the lead termed "external fillets".

During circuit board fabrication, moisture in the form of bonding adhesives, soldering fluxes, etching solutions and plating solutions, can be absorbed into the board material or trapped behind porous platings or crevices inside the holes. The soldering operation generates enough heat to volatliize such moisture resulting in the formation of gasses which are released through heat enlarged pores of the plating into the holes. Unless these gasses escape before the external solder fillets on the top and bottom surfaces cool and harden, they are either entrapped within the hole, or are forced out the external fillets on the bottom surface of the board resulting in solder voids in the fillets such as are described in Printed Circuit Handbook, Clyde F. Coombs, McGraw-Hill Book Company, 1967, pp. 15–19 thru 21.

Heat, during the soldering operation, is applied from the bottom surface of the board. Therefore, the lower temperature of the top surface of the board and heat sink effect of component leads coming out of the board cause the top surface of the solder fillet to harden first. Any gas released into the plated through hole from volatile moisture which is trapped or generated inside the fillet will expand. If the fillet on the top side has hardened, this gas is forced out through the fillet on the bottom surface since that is the last part of the external fillet to harden. Hence, pinholes and blowholes are frequently found on the bottom surface of the board. If the fillet on the bottom surface of the board hardens before the gas has expanded sufficient to escape through the fillet, a hollow fillet with large gas pockets is formed or gasses may be forced between the conductive layers and the insulative panel resulting in delamination.

Mass soldering techniques such as flow and dip soldering have been extensively employed on a mass production basis in the manufacture of such printed circuit boards. Frequently, in addition to the solder void defects and delamination effect previously described, excessive solder effects such as undesirable solder bridging between lines and pads which are spaced relatively close together, is encountered.

Solder bridging has been reduced by selectively treating or coating surface areas of the circuit board, in contact with molten solder during the soldering operation, with plating, oxidizing or chemical solutions which prevent the deposit of solder. This treating or coating is commonly applied in a pattern which is termed a "a solder resist pattern".

One prior art solder resist pattern is selectively applied to each side of a three layer circuit board leaving uncovered by solder resist only the surface areas corresponding to the mounting pads and plated through holes which are to be soldered. This solder resist pattern is intended to keep solder from being deposited on the conductor lines interconnecting the mounting pads thereby reducing excess solder deposits and solder bridges between adjacently located lines and pads. After electronic components have been mounted on a top surface of the printed circuit board in the customary manner, the bottom surface thereof is flow or dip soldered to complete the soldering operation.

The prior art solder resist pattern does not avoid the formation of the solder void defects and the delamination effect previously described. Additionally, the prior art pattern must be custom tailored to not cover the mounting pads and plated through holes for each different circuit configuration to be fabricated. Consequently, manual patter rework is required to accommodate each engineering change in the circuit configuration adding appreciably to the cost of making the boards.

The removal of the above described solder defects, which is essential to reliable operation of the printed circuit, must be accomplished manually by a skilled operator with a soldering iron and materially increases the cost of a completed unit. The detection and correction of these forms of defects is also obviously both a necessary and time consuming operation.

SUMMARY OF THE INVENTION

In accordance with the invention claimed, a circuit board is provided with a new and improved solder resist pattern which eliminates the solder void defects heretofore described, delamination due to entrapped gasses, and the need for a different pattern to correspond to each different circuit configuration. One form of the invention provides a circuit board with a plurality of plated through holes with solder resist covering at least a portion of the circuit board surface along the perimeter of each plated through hole. This portion provides an escape path or port for any gasses released within the plated through hole during the soldering process.

Further, a soldering process is provided wherein one step of the process provides for the formation of an array of solder resist stripes on a surface of the circuit board so that a portion of the stripes is along the surface perimeter of each plated through hole. The strips may, for example, overlap the aperture or at least be tangential to the aperture corresponding to each of the plated through holes. The stripes of solder resist thereby provide at least one solder resist or nonsoldered portion on the perimeter of each hole to define gas paths termed "ports" for holes arranged in a rectangular grid array having uniformly spaced centers corresponding to the stripe spacing.

Another form of solder resist pattern comprises a solid coating of resist on an entire surface of the circuit boards thereby providing solder resist along the entire surface perimeter of each plated through hole.

Accordingly, solder resist patterns are provided which can be applied to all circuit boards having apertures located at uniform standard centers regardless of different circuit conductor and hole configurations. Where the solid resist pattern is used, the uniform standard center restriction is eliminated.

It is therefore, an object of this invention to provide a circuit board in which defects normally occuring during typical mass produced soldering techniques are avoided by use of an improved solder resist pattern.

It is another object of this invention to provide a circuit board having improved component lead solder connections.

It is still a further object of this invention to provide a solder resist pattern that is adapted to use for any circuit board regardless of actual circuit configuration.

It is yet another object of this invention to provide an improved process for soldering electronic component leads to multilayer printed circuit boards.

Further objects and advantages of the present invention will become apparent to those skilled in the art as the description thereof proceeds.

BRIEF DESCRIPTION OF THE DRAWING

The present invention may be more readily described by reference to the accompanying drawings in which:

FIG. 4 is an enlarged sectional view representing a solder joint obtained for the circuit board illustrated in FIGS. 1 and 2 when using the solder resist patterns of the invention; FIG. 5 is a planar surface view of the solder resist pattern of FIGS. 1 and 2;

FIG. 6 is a planar view of a solder resist pattern for a second embodiment of the invention;

FIG. 7 is a planar view of a solder resist pattern for a third embodiment of the invention;

FIG. 8 is a perspective view of a multilayer printed circuit board illustrating an embodiment of the invention.

DETAILED DESCRIPTION OF OPERATION

Figures 1, 2, 3:
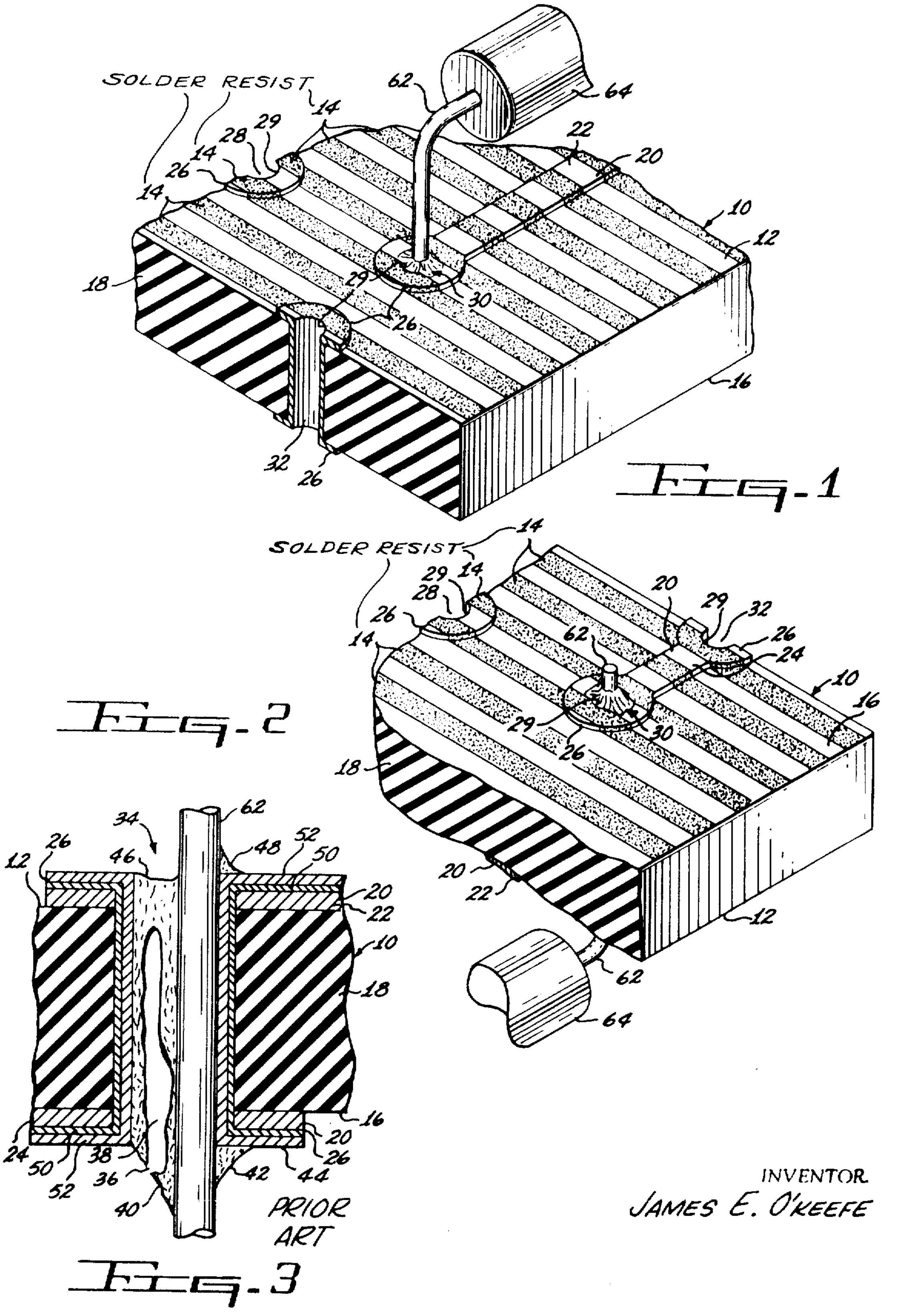
FIG. 1 is a perspective view of one embodiment of the invention showing the top surface of an illustrated circuit board.
FIG. 2 is a perspective view of one embodiment of the invention showing the bottom surface of an illustrated circuit board.
FIG. 3 is an enlarged sectional view of a circuit board representing a prior art solder joint having solder void defects occurring during use of prior art solder resist patterns.

In FIG. 1 there is depicted a double sided plated-through hole printed circuit board 10 showing a top surface 12 of the circuit board having a solder resist pattern comprised of a plurality of substantially equally spaced parallel stripes 14 on the top surface of the circuit board. Similar stripes 14 are formed on a bottom surface 16 of circuit board 10, as is better seen in FIG. 2, in which circuit board 10 is inverted to shown bottom surfaces 16 with solder resist stripes 14 in a repeat of the resist pattern of FIG. 1.

Circuit board 10 is further comprised of an insulative panel 18 having printed circuitry 20 disposed on opposite sides of insulative panel 18. Printed circuitry 20 is separated by insulative panel 18 upon which the printed circuitry is, for example, formed by etching two separate conductive layers bonded to opposite sides of panel 18. Lines 22 and 24 on the top and bottom surfaces of board 10 and annular or apertured mounting pads 26 represent individual printed circuit conductors 22 and 24 and mounting pads 26, respectively. Apertures 28, 30 and 32 are drilled, punched or etched holes which have been plated with an electrically conductive material.

Insulative panel 18 may be of any suitable material such as epoxy glass and of any desired thickness which may be, by way of example, from one thirty-second to one-sixteenth inch. Conductive layers from which conductors 22 and 24 and pads 26 are formed or etched may likewise be of any conductor material, a preferred medium being copper. The selectively etched or formed conductive layers, may be of any desired thickness which may be, by way of example, from one-tenth ml. to standard conductor thickness of 0.0014 inch or 0.0028 inch. The process for producing such a printed circuit board 10 is well known in the art and will not be herein described.

In FIG. 3 there is depicted an enlarged cross sectional view of a plated-through hole 34 of a printed circuit board, representing a prior art soldered joint with solder void defects in the form of a pinhole 36 and a gas pocket 38. In a soldering process employing the prior art solder resist pattern previously described, solder voids occur such as illustrated in FIG. 3 and as described in the handbook reference heretofore identified. For example, large external fillets 40 and 42 appear on bottom surface 44 of the circuit board since no solder resist is present on the surface area immediately surrounding the plated-through hole. As a result of top and bottom surface external fillets 40, 42, 46 and 48 becoming cool enough to harden or "cap over" before gasses generated within the hole can escape, the gasses are trapped within the hole. Upon continuing to expand, the gasses formed the gas pocket 38 and built up sufficient pressure to blow the pinhole 36 in fillet 40.

In FIG. 4 there is depicted an enlarged cross-sectional view of plated-through hole 30 shown in FIG. 2 of printed circuit board 10 representing a soldered joint without solder void defects as a result of employing the solder resist pattern of the invention. Plated-through hole 30 has mounting pads 26 and their associated conductors 22 and 24. These pads and conductors are formed from conductive layers as previously described. A layer of chemically deposited copper 50 is deposited on the bores of the holes and a thicker layer 52 is electroplated over the layer of chemically deposited copper to build up the thickness of the copper conductor material. Suitable chemical solutions for depositing copper layer 50 on nonmetallic insulative substrate materials are produced and marketed by the Shipley Company, Inc., having offices on Walnut Street in Wellesley, Massachusetts under the trademark "Cuposit". The copper plating, although desirably a continuous smooth surface normally is porous, which allows passage of gasses from behind the porous platings into hole 30.

In the preferred embodiment, the first step of the soldering process occurs after the etched circuit board is properly cleaned and includes the coating of the surface of the circuit board with a solder resist pattern illustrated in FIGS. 1 and 2. It is to be understood that the solder resist pattern may be applied on only one surface or on both surfaces of the circuit board.

The solder resist pattern may be applied in the following manner. First, with reference to FIGS. 1, 2 and 5, a solder resist coating in the form of a pattern shown in these figures as shaded stripes 14 is deposited on the top and bottom surfaces of board 10. Preferably, the stripes 14 are applied by a silk or metal screening technique or roller coated wherein stripes of melamine, or other suitable resist material, is selectively deposited on the surface. Preferably, the stripes are arranged in parallel relationship to one another and spaced a predetermined uniform distance apart to form an array aligned with the plated-through holes so that the edges of stripes 14 preferably overlap to some degree or at least are tangential to a surface perimeter 29 or to the apertures in the surface of the circuit board around each of the plated-through holes. With reference to FIG. 4, the resulting pattern provides solder resist on portions of the surface perimeter of hole 30 which serve as escape paths or ports 54, 56, 58 and 60 for gasses generated within the hole during the soldering process in a manner to be described hereinafter.

After the solder resist step has been completed, the various electric components to be mounted on the printed circuit board are inserted into the plated-through holes from the top side of the circuit board. The leads of each component are passed through the particular hole provided therefore and are clipped substantially flush with he bottom surface of the board. For example, a component lead 62 of a circuit component 64 is inserted in the hole as illustrated in FIGS. 1, 2 and 4 and held in a fixed relation to the bottom of the circuit board in a known manner in preparation for the soldering step of the process.

After all the various component leads have been inserted into the printed circuit board, a liquid solder flux is then preferably applied to the bottom surface of the circuit board, as by brushing or by immersing the board in a flux solution. One particular solder flux which has been employed in this operation is sold commercially under the trade name Formula No. 1547 Soldering Flux by the Kester Solder Co., of Chicago, Illinois. It is to be understood, however, that any conventional solder flux employed in the printed circuit art may be utilized without departing from the invention.

Following the application of solder flux, the circuit components are then soldered to the boards. This soldering operation is preferably performed, for example, by placing, moving or passing the circuit boards into contact with a wave of molten solder such as that provided by a conventional wave soldering machine. In such a process, the bottom surface of the board contacts the solder with the result that the component lead is soldered to the plated-through hole in which it is inserted and to the mounting pads 26.

During the soldering operation, if the plated-through hole is plated with a material which readily accepts solder, such as copper, solder flows to the top surface of the circuit board by capillary action. With reference to FIG. 4, before external solder fillets 66 and 68 harden at the top surface 12, gasses from within the hole may escape by way of the paths provided by portions 54, 56, 58 and 60 of external fillets 66, 68, 70 and 72. Portions 54, 56, 58 and 60 do not harden so rapidly as to trap the gasses, released during the soldering process within hole 30, which produce defective solder joints. After the solder on the top surface of the board hardens, the resultant gasses will take the paths of least resistance; namely, of ports 54 and 56.

The solder resist stripes 14 also cover a portion of conductive annular mounting pads around each plated-through hole thus reducing the size of external fillets 66, 68, 70 and 72 as shown in FIG. 4. As a result, the amount of solder on the surface of the board is reduced. The solder resist on the perimeter of each hole is effective to provide a port on the perimeter of the barrel fillet in each hole to allow the escapement of gasses and aids in facilitating the flow of solder by capillary action up hole 30 until it is subsequently filled with solder and forms a voidless solder joint. It is believed that the solder resist on the perimeter of each hole is effective to slow down the hardening of the top surface fillets since the fillets are reduced in size, exposing less of the fillet to external cooling. As a result, gasses are allowed to escape during a longer interval of time permitting substantially all gasses from within the hole to escape before the fillets on the top and bottom surfaces have hardened. Thus, the solder voids created by gasses in the prior art are eliminated by the solder resist pattern providing a gas escape path for each plated-through hole.

Another embodiment of the invention involves an extension of a single stripe pattern illustrated in FIGS. 1, 2 and 5 to a double stripe pattern illustrated in FIG. 6. With reference to FIG. 6, a second set of stripes shown by shaded stripes 74 are provided which are superimposed over a first set of stripes provided in accordance with the preferred embodiment heretofore described. The resulting pattern forms a rectangular grid which may be applied to the surface of the circuit board in a manner similar to the single stripe pattern to provide additional gas escape ports in a like manner.

The second set of stripes 74 may be, for example, perpendicular to stripes 14 and spaced the same predetermined uniform distance apart as the first set of stripes. The double striped pattern provides for a further reduction of surface solder. Another advantage of such an array is the provision of a rectangular grid for uniform centers of plated-through holes for mounting components as previously described.

A third embodiment is illustrated in FIG. 7 and may be termed a "solid resist pattern" where the entire surface excluding the plated-through hole bores 30 is coated with a solder resist 14. The solder resist 14 on the surface 12 of each mounting pad 26 around the perimeter 29 of each aperture 30 provides a continuous gas escape port on the surface perimeter 29 of each hole 30 in the manner previously described. This pattern has the advantage of requiring no selective coating of resist, however, it does require an additional step in the soldering process; namely, tapping or vibrating the circuit board 10. The tapping and vibrating is required while the bottom surface of the circuit board 10 is in contact with the solder wave to initiate capillary action for drawing solder up into the hole 30 during the soldering step. Since the entire surface 12 of the circuit board is covered with solder resist 14 a common solder resist pattern is provided regardless of the circuit conductor and hole configuration.

The solder resist patterns illustrated in Figs 5, 6 and 7 provide an additional advantage by covering a portion of the mounting pads 26 with solder resist to increase bonding strength between the pads and the surface of the circuit board. This aids in eliminating separation between the pads and surface commonly known as "lifted circuit pads" when soldered joints are heated for removal and reinsertion of leads.

While the invention is described with reference to a double sided plated-through circuit board, it is equally well adapted and readily extended for use with a multilayer printed circuit structure such as illustrated in FIG. 8. In FIG. 8, there is depicted a printed circuit board having, by way of example, alternate conductive and insulative layers with conductive layers on the top and bottom surfaces of the circuit board.

Accordingly, each of the circuit boards having any of the three solder resist patterns described with reduce the size of external fillets on the surface of the circuit boards, eliminating the formation of solder bridges between adjacent conductor lines and mounting pads on the circuit board and eliminating lifted circuit pads. Moreover, gas escape ports for plated-through holes or apertures are provided to eliminate blowholes, gas pockets and pinholes associated with solder voids. Furthermore, solder resist patterns are provided for uniform standard center component mounting arrangements whereby a common solder resist pattern can be employed regardless of circuit conductor and hole configurations.

While the principles of the invention have been made clear in the illustrated embodiments, there will be obvious to those skilled in the art, many modifications in structure, arrangements, proportions, the elements, materials and components used in the practice of the invention and otherwise which are adapted for specific environments and operating requirements, without departing from the principle. The appended claims are, therefore, intended to cover and embrace any modifications within the limits only of the true spirit and scope of the invention.

What is claimed is:

1. A circuit board comprising:

an insulative panel having a pair of oppositely disposed surfaces and an aperture formed therein::

a layer of conductive material lining said aperture;

a mounting pad of conductive material on one surface of said panel surrounding and electrically connected to one end of the layer of conductive material lining said aperture; and solder resist disposed on said mounting pad covering at least a portion of the mounting pad from the perimeter of the aperture to the outer perimeter of the mounting pad;

said aperture being adapted to be filled with molten solder in a temperature environment altered by said solder resist, in which environment said solder cools and hardens last at said one surface.

2. A circuit board comprising:

an insulative panel having a pair of oppositely disposed surfaces and a plurality of apertures formed therein, each of said apertures extending through said board and terminating at the surfaces of said board;

a layer of conductive material lining selected ones of said apertures;

said selected apertures adapted to receive the lead of a component for mounting therein and adapted to be filled with molten solder in a temperature environment in which said solder will harden first in said aperture at one of said surfaces;

mounting pads of an electrically conductive material on the other surface of said panel, each of said mounting pads surrounding and electrically connected respectively to the conductive material lining each of said selected apertures; and solder resist selectively disposed on said mounting pads covering at least a portion of the selected mounting pads from the perimeter of the aperture to the outer perimeter of the mounting pads.

3. A circuit board comprising:

an insulative panel having a pair of oppositely disposed surfaces;

a plurality of holes formed in said insulative panel; a layer of conductive material lining said holes;

said holes being adapted to be filled with molten solder in a temperature environment in which said solder will harden first at an end of said holes adjacent one of said surfaces;

annular mounting pads of a conductive material formed on the other surface of said panel, each of said pads being in electrical contact with the layer of conductive material lining one of said holes; and solder resist selectively deposited on said other surface of said panel, said solder resist covering at least a portion of said pads from the perimeter of said holes to the outer perimeter of the pads, whereby the formation of solder fillets is controlled when solder is received at said holes and hardens at said one end.

4. The circuit board of claim 3 wherein said solder resist is deposited as stripes substantially parallel to each other and spaced a predetermined uniform distance apart.

5. The circuit board of claim 3 wherein said solder resist is deposited as stripes to provide a first set of a plurality of solder resist stripes which are substantially parallel to each other and to provide a second set of a plurality of parallel solder resist stripes which are substantially perpendicular to said first set of stripes.

6. The circuit board of claim 3 wherein said solder resist is selectively deposited to substantially contact the entire surface perimeter of said holes.

7. A circuit board comprising:

a plurality of components, each of said components having a component lead;

an insulative panel having a pair of oppositely disposed surfaces and a plurality of holes formed therein, selected ones of said holes being adapted to receive a component lead;

a layer of conductive material lining each of said holes;

annular mounting pads of conductive material on oppositely disposed surfaces of said board, a pair of said pads being in electrical contact with the conductive linings of each of said holes;

solder resist selectively deposited on the surfaces of said panel, said solder resist covering at least a portion of said pads from the perimeter of said holes to the outer perimeter of said mounting pads; and leads of components being inserted into the selected ones of said holes and being soldered to the linings thereof.

8. The circuit board of claim 7 wherein said solder resist is deposited on at least one of said oppositely disposed surfaces as stripes substantially parallel to each other and spaced a predetermined uniform distance apart.

9. The circuit board of claim 7 wherein said solder resist is deposited on at least one of said oppositely disposed surfaces as stripes to provide a first set of solder resist stripes which are substantially parallel to each other and a second set of solder resist stripes which are substantially parallel to each other and which are substantially perpendicular to said first set of stripes.

10. The circuit board of claim 7 wherein said solder resist is deposited on at least one of said oppositely disposed surfaces to contact substantially the entire surface perimeter of each of said holes.

11. A circuit board comprising:

an insulative panel having a pair of oppositely disposed surfaces and an aperture formed therein;

a layer of conductive material lining said aperture;

a mounting pad of conductive material on one surface of said panel surrounding and electrically connected to one end of the layer of conductive material lining said aperture; and solder resist disposed on said mounting pad covering at least a portion of the mounting pad from the perimeter of the aperture to the outer perimeter of the mounting pad, said solder resist being disposed on said mounting pad to alter the temperature environment in said aperture at said one surface when molten solder is introduced into said aperture, said solder resist being applied to the surface which cools last, to permit gas to escape from within said aperture.

12. A circuit board for soldering a lead of a component thereon comprising:

an insulative panel having a pair of oppositely disposed surfaces and a plurality of apertures formed therein, each of said apertures extending through said board and terminating at the surfaces of said board;

a layer of conductive material lining selective ones of said apertures;

said selected apertures adapted to receive the lead of the component for mounting therein;

mounting pads of an electrically conductive material on one surface of said panel, each of said mounting pads surrounding and electrically connected respectively to the conductive material lining each of said selected apertures; and solder resist selectively disposed on said mounting pads covering at least a portion of the selected mounting pads from the perimeter of the aperture to the outer perimeter of the mounting pads, said solder resist being disposed on said mounting pads, said solder resist being disposed on said mounting pads to alter the temperature environment in said selected apertures at said one surface when molten solder is introduced into said selected apertures to solder the lead of the component therein, said solder resist being applied to the surface which cools last, to permit gas to escape from within said selected apertures.

13. A circuit board comprising: an insulative panel having a pair of oppositely disposed surfaces;

a plurality of holes formed in said insulative panel;

a layer of conductive material lining said holes;

annular mounting pads of a conductive material formed on on surface of said panel, each of said pads being in electrical contact with a layer of conductive material lining of said holes; and solder resist selectively deposited on said one surface of said board, said solder resist covering at least a portion of said pads from the perimeter of said holes to the outer perimeter of the pads, whereby the formation of solder fillets is reduced when molten solder is introduced into said aperture, said solder cooling last at said one surface.

14. A circuit board comprising:

an insulative panel having a pair of oppositely disposed surfaces and a plurality of apertures formed therein, each of said apertures extending through said board and terminating at the surface of said panel;

a layer of conductive material lining selected ones of said apertures;

mounting pads of an electrically conductive material on both surfaces of said panel, each of said mounting pads surrounding and electrically connected respectively to the conductive material lining each of said selected apertures; and solder resist selectively disposed on said mounting pads covering at least a portion of said mounting pads from the perimeter of the aperture to the outer perimeter of the mounting pads.